United States Patent
Yoshida (10) Patent No.: US 6,528,825 B2
(45) Date of Patent: Mar. 4, 2003

(54) SEMICONDUCTOR EMISSION APPARATUS (75) Inventor: Hiroshi Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/947,979

(22) Filed: Sep. 6, 2001

(65) Prior Publication Data

US 2002/0100914 A1 Aug. 1, 2002

(30) Foreign Application Priority Data

Sep. 7, 2000 (JP) ........................................ 2000-271301

(51) Int. Cl.[7] ............................................... H01L 33/00
(52) U.S. Cl. ............................ 257/81; 257/82; 257/83; 257/84; 257/85; 250/216
(58) Field of Search ...................... 257/81–85, 431–435; 250/216, 214.1, 239; 438/22, 24, 48, 54, 69, 70

(56) References Cited

U.S. PATENT DOCUMENTS

| 5,715,337 | A | * | 2/1998 | Spitzer et al. ............... 359/209 |
| 5,835,514 | A | * | 11/1998 | Yuen et al. .................... 257/81 |
| 5,925,898 | A | * | 7/1999 | Spath .......................... 257/432 |
| 2002/0047088 | A1 | * | 4/2002 | Ishii et al. ................ 250/214.1 |

FOREIGN PATENT DOCUMENTS

| JP | 06-456/84 | 5/1994 |
| JP | 07-92411 | 4/1995 |
| JP | 11-154766 | 6/1999 |

* cited by examiner

Primary Examiner—David Nelms
Assistant Examiner—Long Tran
(74) Attorney, Agent, or Firm—Sonnenschein, Nath & Rosenthal (57) ABSTRACT Disclosed is a semiconductor emission apparatus capable of emitting only a unimodal beam by a simple configuration without designing materials. The size of a light-leading window provided in a shielding cover is set so as to shield Cherenkov, light generated in a semiconductor laser using a GaN substrate and hold it inside the apparatus. The optical path of Cherenkov light is represented by the conical face with the apex angle having the emitting direction of the beam from the semiconductor laser as an axis. The apex angle at this time is about from 20° to 23°. The light-leading window is to have the cross sectional form in the shielding cover of a conical face with the apex angle defined in the same manner, and the apex angle is to be 20° or less. As a result, the beam pattern emitted from the light-leading window becomes unimodal.

10 Claims, 9 Drawing Sheets

PRIOR ART

SEMICONDUCTOR EMISSION APPARATUS

RELATED APPLICATION DATA

The present application claims priority to Japanese Application(s) No(s). P2000-271301 filed Sep. 7, 2000, which application(s) is/are incorporated herein by reference to the extent permitted by law.

BACKGROUND OF THE INVENTION

1. Field of the Invention

The present invention relates to a semiconductor emission apparatus serving as a light source for optical recording systems, laser printers, laser displays and the like, more specifically to a semiconductor emission apparatus comprising a semiconductor light-emitting device with a short-wavelength such as a blue-colored semiconductor laser inside its package.

2. Description of the Related Art

In general, in a semiconductor emission apparatus such as LDs (Laser Diodes), laser oscillation is performed by amplifying light using a Fabry-Pe'rot resonator in which light goes back and forth between two mirrors placed parallel to each other. At this time, the degree of parallel between the two mirrors is extremely important. For example, a gallium arsenide (GaAs) substrate, which is mainly used for a laser for CDs (Compact Discs), MDs (Mini Discs) or DVDs (Digital Video Discs), is extremely excellent in the cleavage characteristic and the degree of parallel between the end faces formed by cleaving becomes uniform in atomic order (by 5 angstrom unit). Therefore, if the end face of a resonator is formed using a GaAs substrate, an excellent mirror of the resonator can be obtained.

On the contrary, sapphire is used for a substrate of a device in a semiconductor emission apparatus formed by laminating Group III–V nitride semiconductor film. A sapphire substrate is capable of growing a semiconductor film having an excellent crystalline characteristic. On the other hand, the sapphire substrate has a poor cleavage characteristic so that the degree of parallel between the end faces formed by cleaving becomes notably poor. Therefore, research and development have been proceeded on substrate materials with excellent cleavage characteristics, which can be substitutes for sapphire. Specifically, silicon carbide (SiC), gallium nitride (GaN) and the like have been studied.

Among those mentioned, a GaN substrate is advantageous as a substrate for a semiconductor laser since a GaN semiconductor, which is the same kind of the substrate, can be easily grown thereon with a high crystalline characteristic, and also impurities can be added to the substrate itself giving it electrical conductivity. However, the semiconductor laser using the GaN substrate has a problem that the beam pattern (Far Field Pattern; FFP) is not perfectly unimodal.

When using the semiconductor laser for light source of systems such as optical disk systems or laser-beam printers, it is generally desirable that the FFP is unimodal. For example, spikes and the like generated at the end of the beam, which cannot be ignored, become noises on the system application. The reason is that if there are a plurality of pits when concentrating light emitted from the semiconductor laser, two spots are formed in the optical disk and two dots are formed in the laser-beam printer. In practice, the unimodal FFP is used for 780 nm band and 650 nm band lasers (for example, SLD231, 233, 134, 1133) for CDs, MDs, DVDs, and laser printers, which have already been on the market.

Figure 1A:
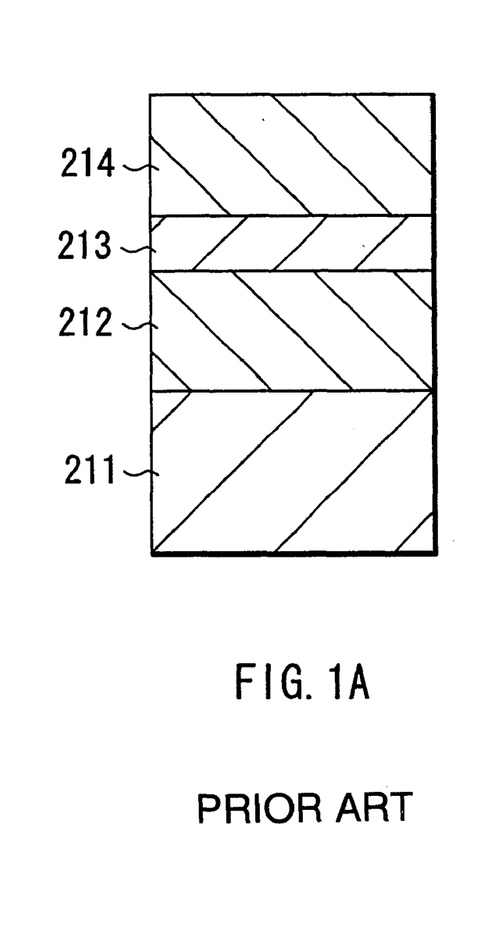
FIG. 1A shows the configuration of the device.
Figure 1B:
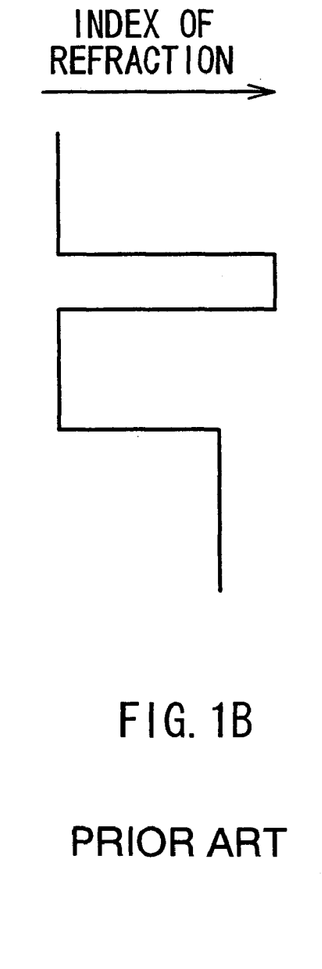
Figure 1C:
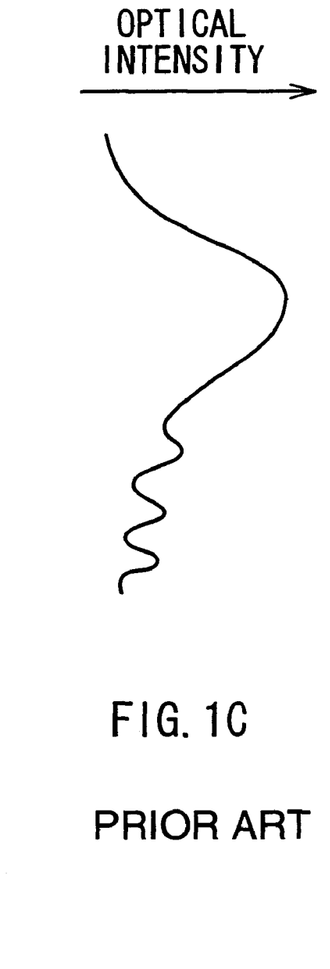
Figure 1D:
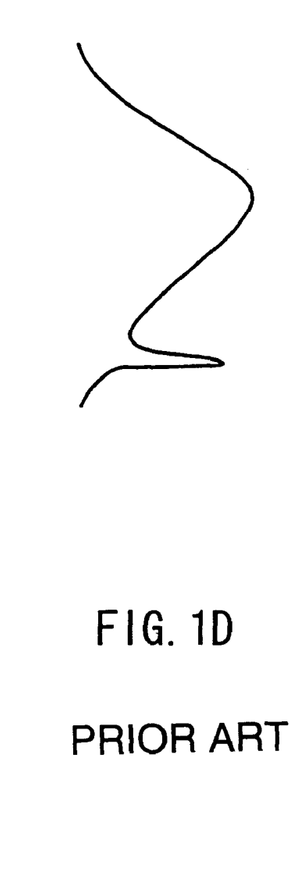

Therefore, control of the beam pattern becomes the subject. It will be described by referring to FIGS. 1A to 1D. FIG. 1A shows a basic structure of a semiconductor laser having a configuration in which a cladding layer 212, an active layer 213, and a cladding layer 214 are laminated on a GaN substrate 211. The distribution of index of refraction of the laser in the laminating direction is as shown in FIG. 1B. The light is confined in the active layer 213 by the two cladding layers 212 and 214. However, the mode confined in the active layer 213 leaks to the cladding layer 212 and decreases exponentially as getting closer to the GaN substrate 211. When the waveguide mode of the active layer 213 cannot be sufficiently decreased due to the insufficient layer thickness of the cladding layer 212 and reaches the substrate, light leaks inside the GaN substrate 211. The light distribution in this case is as shown in FIG. 1C. When the light guided by such light distribution is emitted from the semiconductor laser, the FFP does not become unimodal but has two spike-like sharp peaks as shown in FIG. 1D. In other words, in the waveguide mode in this case, there are two waves such as the mode component in the active layer 213 and the leak component in the GaN substrate 211. The latter forms a spike in the FFP.

In general, there are two methods considered for suppressing the generation of the spike-like peaks as described. One is to reduce the index of refraction of the cladding layers especially the cladding layer 212 on the substrate side and the other is to thicken the layer thickness. In the Group III–V nitride semiconductor laser using the GaN substrate, it is necessary to reduce the index of refraction by increasing the amount of aluminum (Al) in the cladding layer, which is $Al_xGa_{1-x}N$ layer, or to increase the layer thickness. In order for the $Al_xGa_{1-x}N$ layer to effectively confine (that is, coefficient of confinement is 0.02 and more) the light inside the active layer, it is necessary to increase the amount of aluminum (Al) to the composition ratio x>0.06. On the other hand, the critical film thickness determined by the elastic constant and differences in the lattice constant between the GaN and the $Al_xGa_{1-x}N$ decreases reciprocal to the amount of aluminum (Al). Therefore, when the index of refraction is decreased, cracks are easily generated so that it becomes difficult to increase the film thickness. Considering the values of properties of the GaN and the $Al_xGa_{1-x}N$, which is distinctive to the materials, such as the lattice constant, the index of refraction, and the elastic coefficient, it is extremely difficult to satisfy the two conditions at the same time, that is, to confine the light and have the sufficient critical film thickness even by changing the value of properties by designing the materials.

As described, in the Group III–V nitride semiconductor laser using the GaN substrate, it is difficult to suppress generation of the spike-like peaks by the methods of the related art in which the values of properties is controlled by designing the materials.

SUMMARY OF THE INVENTION

The invention is designed to overcome the foregoing problems. The object is to provide a semiconductor emission apparatus capable of emitting only unimodal beams by a simple structure without designing materials.

A semiconductor emission apparatus of the invention comprises a semiconductor light-emitting device oscillating an optical beam; and an enclosing member (package) for enclosing the semiconductor light-emitting device while having a light-leading window for emitting a beam oscillated from the semiconductor light-emitting device, and for shielding unnecessary components among the components of the beam. The invention is especially effective in the case where the semiconductor light-emitting device has a structure in which Group III–V nitride semiconductor film including at least one kind of element selected from the group consisted of aluminum (Al), gallium (Ga), indium (In) and boron (B) is laminated on a substrate made of gallium nitride (GaN).

In a semiconductor emission apparatus of the invention, the unnecessary components among the beam components oscillated from the semiconductor light-emitting device is shielded by the enclosing member (package) itself. As a result, only the necessary unimodal beam component is emitted from the light-leading window.

Other and further objects, features and advantages of the invention will appear more fully from the following description.

BRIEF DESCRIPTION OF THE DRAWINGS

FIGS. 1A to 1D are figures for describing generation of mode by Cherenkov light in a semiconductor light-emitting device. FIGS. 1B, 1C, and 1D show the distribution of the index of refraction, the optical distribution, and the FFP each corresponding to the figure of the device configuration, respectively.

DETAILED DESCRIPTION OF THE PREFERRED EMBODIMENTS

In the followings, preferred embodiments of the invention will be described in detail by referring to the drawings.

First Embodiment

Figure 3:
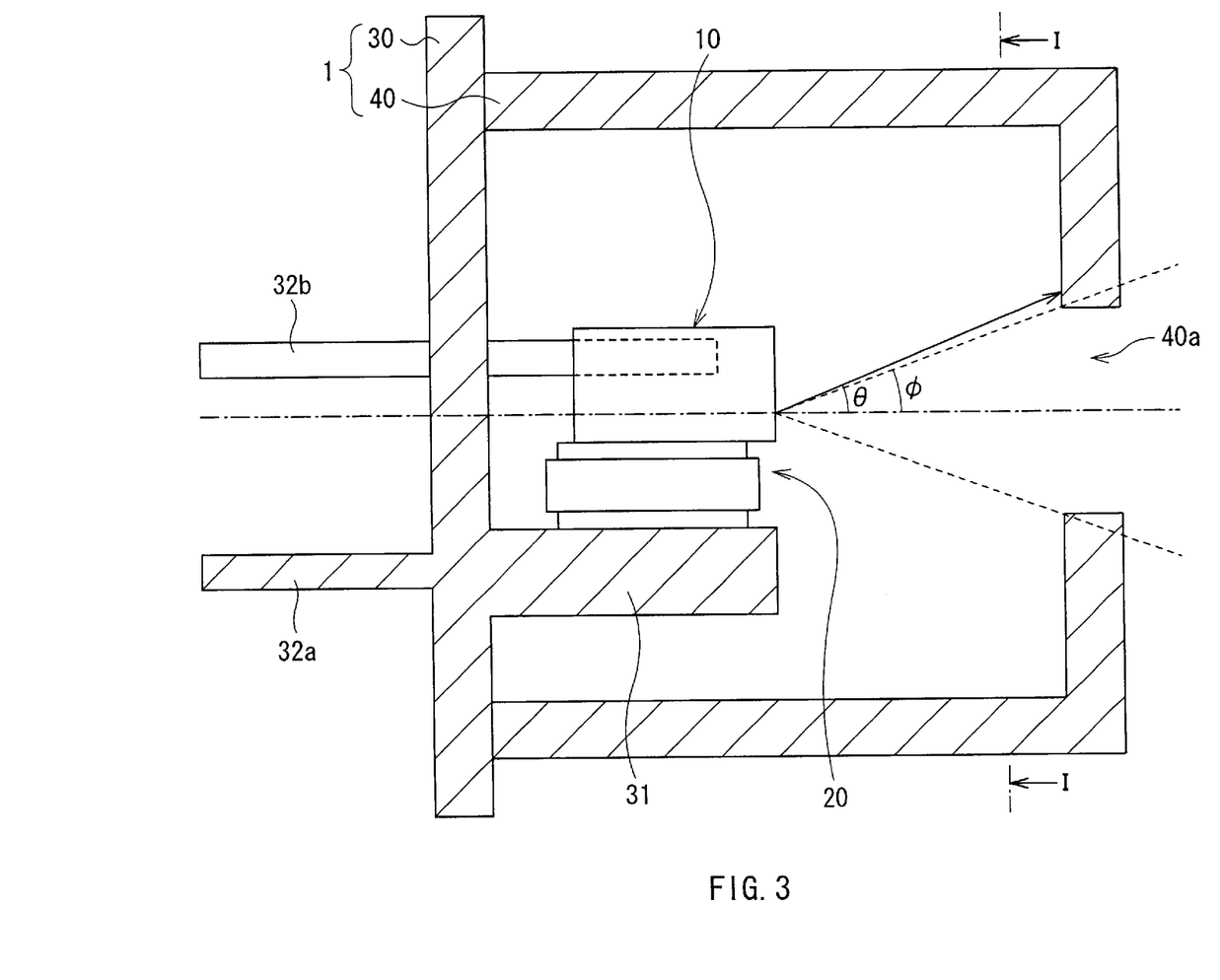
FIG. 3 is a cross section showing the configuration of a semiconductor emission apparatus according to a first embodiment of the invention.
Figure 4:
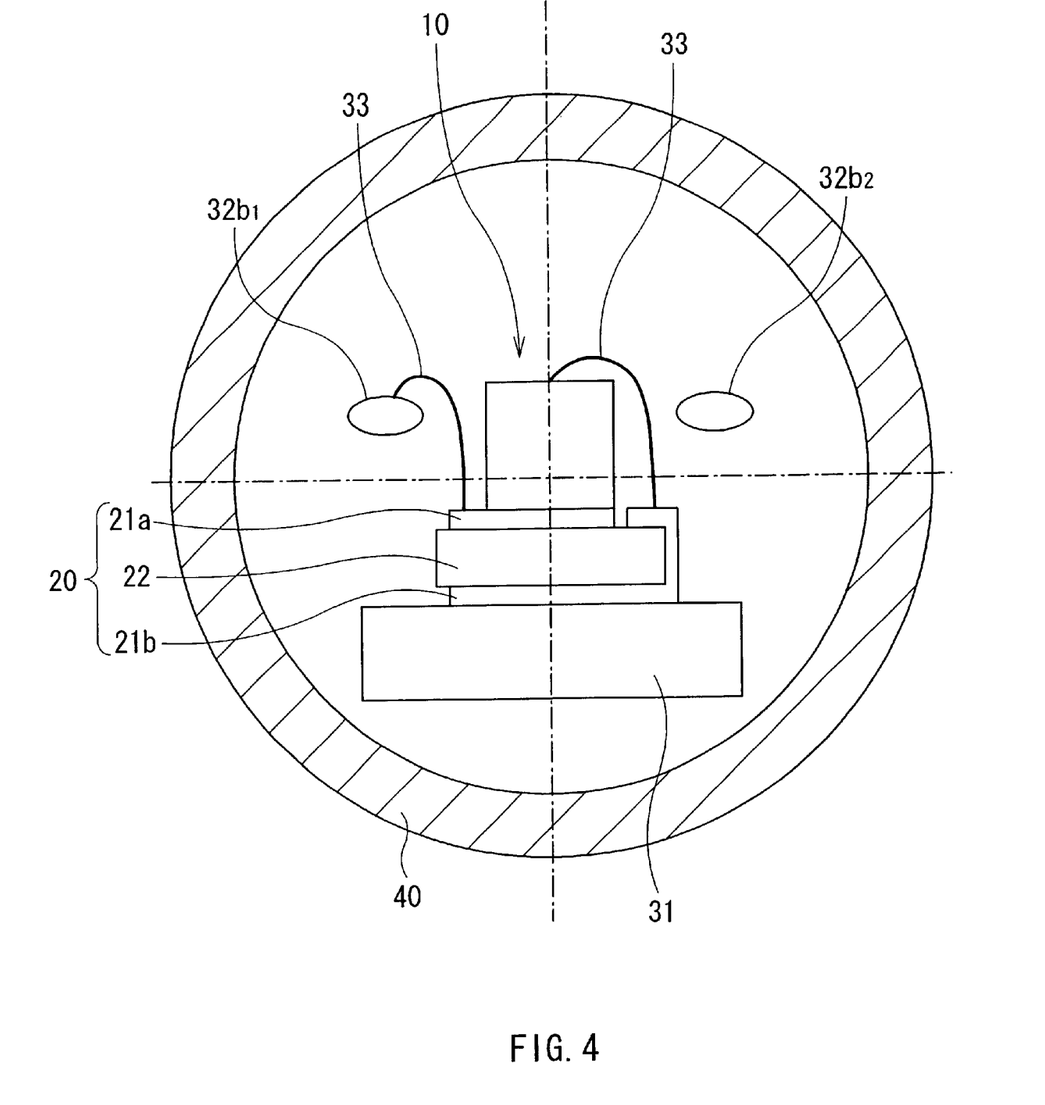
FIG. 4 is a plan view of the semiconductor emission apparatus shown in FIG. 3.

FIG. 3 shows side-cross-sectional configuration of a semiconductor emission apparatus according to a first embodiment of the invention and FIG. 4 shows the perspective configuration taken along the line I—I in FIG. 3. In a semiconductor emission apparatus according to the embodiment, a Group III–V nitride semiconductor laser 10 using a GaN substrate is enclosed inside a package (enclosing member) 1. The package 1 is mainly composed of a sub-mount 20 for attaching the semiconductor laser 10, a circular base 30 for holding the sub-mount 20, and a shielding cover 40 surrounding the semiconductor laser 10.

The base 30 is formed of metal such as Fe (iron) or Cu (copper). A heat sink 31 is provided on one side (inner face) of the base 30 as, for example, one body with the base 30. The heat sink 31 is made of a material having conductivity and excellent thermal conductivity such as copper (Cu). A conductive pin 32a made of, for example, iron (Fe) or copper (Cu) is provided on the other side (outer face) of the base 30, and the pin 32a is electrically connected to the heat sink 31. The semiconductor laser 10 is placed on the heat sink 31 with the sub-mount 20 being interposed therebetween, and is electrically and thermally connected to the heat sink 31.

In the position on the outer face of the base 30 facing the semiconductor laser 10, two pins $32b_1$ and $32b_2$ are provided for taking out electrode leads of the semiconductor laser 10. Each of the two pins $32b_1$ and $32b_2$ is provided through the base 30 and the through portions are fixed by, for example, welding to insulating glass. Thereby, the inside of the package is hermetically sealed and each of the two pins $32b_1$ and $32b_2$ is electrically insulated from the base 30. At this time, as shown in FIG. 4, the pin $32b_1$ on the left is electrically connected to the semiconductor laser 10 via the sub-mount 20. The other pin $32b_2$ can be used for connecting a PD (Photo Diode) for a monitor and the like when necessary.

Figure 5:
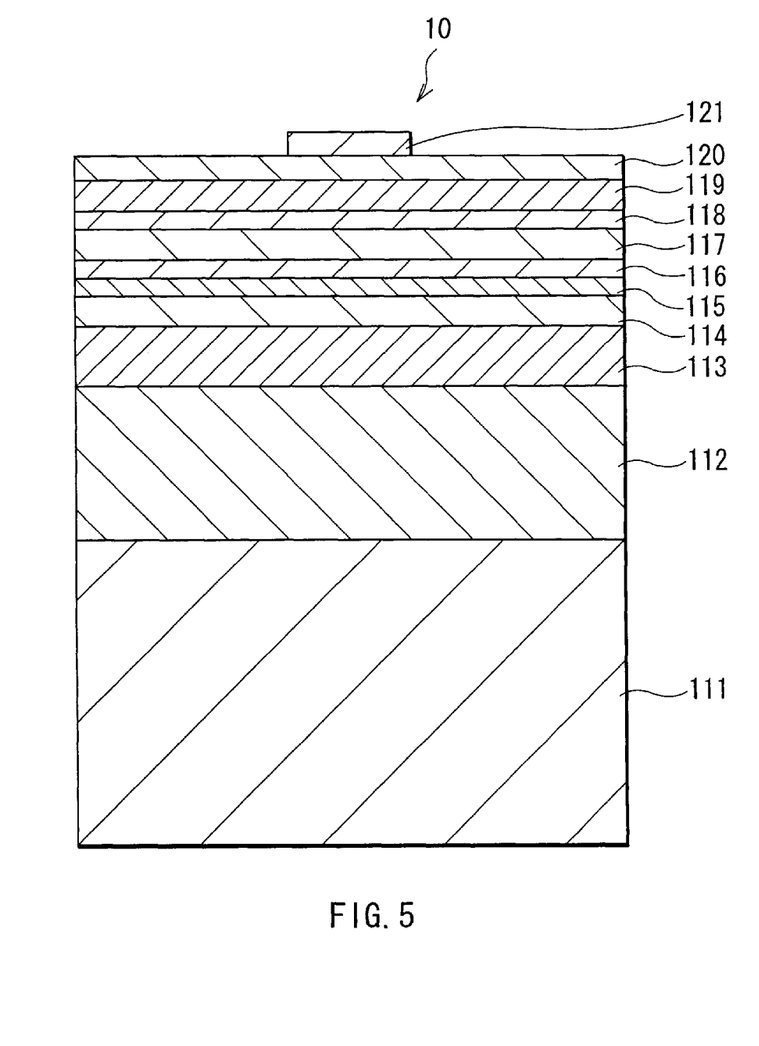
FIG. 5 is a cross section showing the configuration of a semiconductor light-emitting device used in the semiconductor emission apparatus shown in FIG. 3.

The semiconductor laser 10 has a laser structure, for example, in which Group III–V nitride semiconductors including at least one element selected from the group consisted of aluminum (Al), gallium (Ga), indium (In) and boron (B) are laminated as shown in FIG. 5. In other words, on a GaN substrate 111, an n-type contact layer 112, an n-type cladding layer 113, an optical guide layer 114, a multi-quantum well active layer 115, an anti-diffusion layer 116, an optical guide layer 117, an anti-carrier-overflow layer 118, a p-type cladding layer 119, a p-type contact layer 120, and a p-side electrode 121 are laminated in order. At this time, the GaN substrate 111 has n-type electric conductivity, and the semiconductor laser 10 is mounted on the sub-mount 20 with the GaN substrate 111 up and the p-side electrode 121 down.

The sub-mount 20 comprises a substrate 22 using, for example, aluminum nitride (AlN) as the base material and a metallic layer 21a is provided on the top surface of the substrate 22 and a metallic layer 21b is provided on the bottom surface of the substrate 22. The metallic layer 21b is formed from one of the surface of the substrate 22 towards the other metallic layer 21a side so that a portion of the metallic layer 21b is formed on the same surface as the metallic layer 21a. The metallic layers 21a and 21b are formed not to be continuity by, for example, providing a gap in between. The metallic layer 21a is connected to the p-side electrode 121 of the semiconductor laser 10 and connected to the pin $32b_1$ on the left in FIG. 2 by a wire 33. The metallic layer 21b is electrically connected to the GaN substrate 111 of the semiconductor laser 10 through the wire 33 and also connected to the heat sink 31. Thereby, via the sub-mount 20, the p-side electrode 121 of the semiconductor laser 10 is connected to the pin $32b_1$ and the GaN substrate 111 is connected to the heat sink 31 and to the pin 32a on the back surface of the heat sink 31.

A shielding cover 40 is formed in a cylindrical shape with a bottom using, for example iron (Fe) or copper (Cu) and has functions of protecting the semiconductor laser 10 therein and of shielding the light so that the light emitted from the semiconductor laser 10 leaks in no direction other than the emitting direction. The shielding cover 40 is formed so as to be in one body by the opening side being closely attached to the base 30, and a light-leading window 40*a* with, for example, a circular shape is provided on the other side, that is, the bottom side (the side where light is emitted). The light-leading window 40*a* is formed in the predetermined size and the laser light emitted from the semiconductor laser 10 is to be lead out from the light-leading window 40*a*.

A spike-like peak component among the laser light emitted from the semiconductor laser 10, that is, the light derived from the mode of the substrate is called Cherenkov light. In the embodiment, in the Group III–V nitride semiconductor laser using the GaN substrate, the size of the light-leading window 40*a* is set so as to shield the generated Cherenkov light and confine it inside in order to make the beam pattern emitted from the apparatus unimodal as a result.

The optical path of Cherenkov light when having the structure shown in FIG. 1A, for example, can be obtained by the following formula where the index of refraction of the GaN substrate 211 is nsnb, and the index of effective diffraction in the waveguide path formed by the first cladding layer 212, the active layer 213, and the second cladding layer 214 is neff.

$$\sin^2\theta = nsub^2 - neff^2 \quad (1)$$

Figure 2:
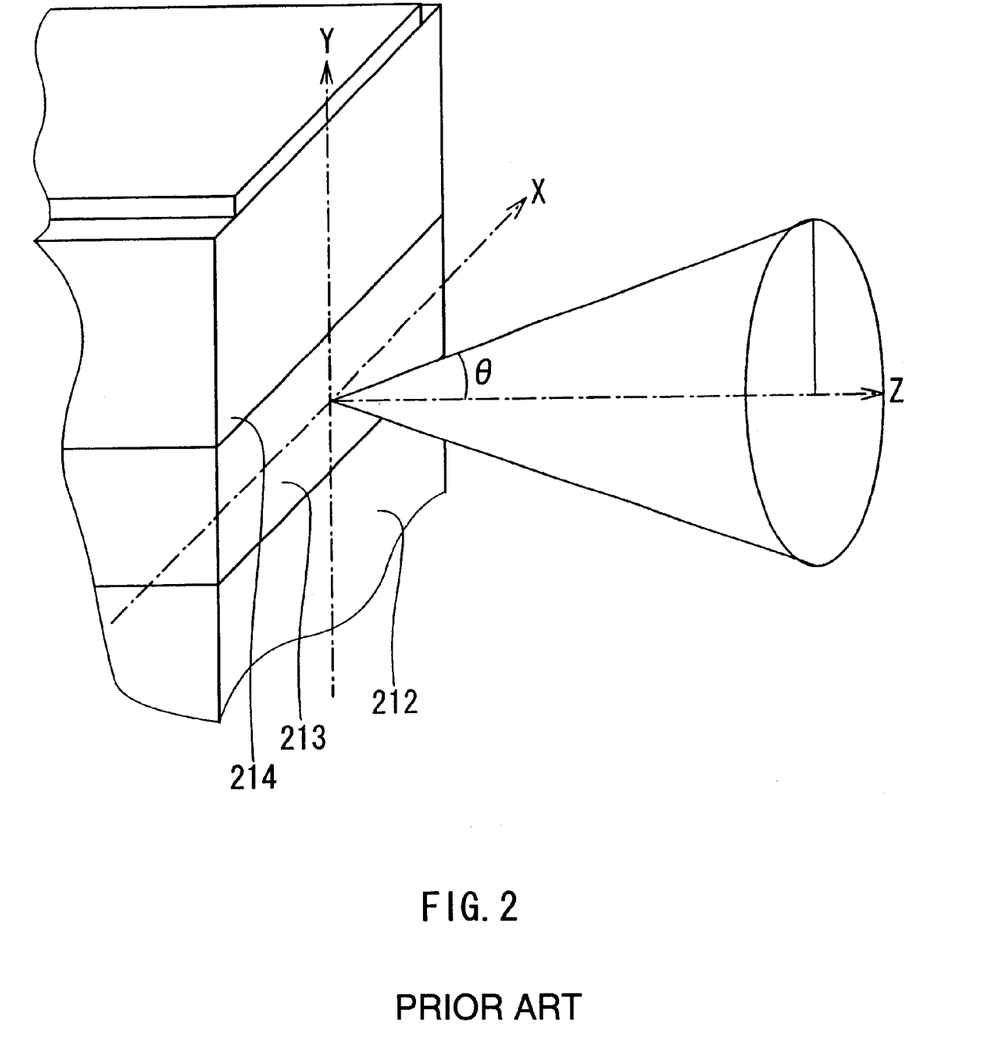
FIG. 2 is a figure for describing the position of Cherenkov light in the semiconductor emission apparatus.

The angle θ is defined as shown in FIG. 2. In other words, it is the angle between the Z-axis and a generating ling in a cone with the node of three axes, X, Y, and Z as the apex and the Z-axis as the perpendicular, provided that the line in the center of the thickness of the active layer 213 on the end face for beam emission is the X-axis, the line in the center of the electric current injection region by an electrode in the width direction provided on the upper portion of the second cladding layer 214 is the Y-axis, and the line orthogonal to the two axes (end face) in the longitudinal direction of the resonator is the Z-axis. This is the angle of a conic face with the center of beam on the beam emission end face as the apex and the conic face is the wave surface of Cherenkov light. In other words, a spike appears on the permitted by law. conic face with the apex angle θ.

This can be confirmed by the EFP in the lamination (vertical) direction and has been confirmed in practice by measurement (for example, S. Nakamura et. al., Appl. Phys. Lett. 73,832 (1998), Masaaki Nido et. al., Extended Abstracts 4p-W-4 (The 60th Autumn Meeting, 1999)., The Japan Society of Applied Physics). According to the reports, in FFP in the vertical direction when forming an $Al_xGa_{1-x}N$ layer with no crack capable of confining the sufficient amount of light in the active layer, a spike-like peak is observed in the position where the apex angle θ is about 20°.

Therefore, the size of the light-leading window 40*a* can be inductively obtained from the FFP of the semiconductor laser 10. At this time, it is obtained using the formula (1) with the position of Cherenkov light as the angle θ.

The value of nsub of the GaN substrate is 2.536 (for example, D. Brunner et. al., J. Appl. Phys. 82,5090 (1997)). The value of neff is about 2.507 even if there are a little errors depending on the composition and the layer thickness. Therefore, the angle θ obtained by the formula (1) in this case is 22.5°. However, if the light leaked to the substrate increases, the value of neff becomes smaller and the angle θ increases. Also, by taking the width of the spread angle of the spike into consideration, the angle θ of the substantial optical path of Cherenkov light can be estimated to be from 20° to 23°. It is shown in FIG. 3 by an arrow.

The size of the light-leading window 40*a* is defined as the cross section at the tip of the shielding cover 40 of a cone (dotted line in the figure) with the apex angle φ with the beam emitting direction as the axis. The apex of the cone is the node of three axes, X, Y and Z when the line in the center of the thickness of the active layer 213 on the end face for beam emission is the X-axis, the line in the center of the electric current injection region by the p-type electrode 121 in the width direction is the Y-axis, and the line orthogonal to the two axes (end face) in the longitudinal direction of the resonator is the Z-axis. The center line shown in FIG. 3 is the emitting direction of beams and corresponds to the Z-axis. Also, the two center lines orthogonal to each other shown in FIG. 4 correspond to the X-axis and Y-axis. In the embodiment, the apparatus is designed so that the three axes are also the center axis of the shielding cover 40. According to the optical path of Cherenkov light mentioned above, the apex angle φ of the light-leading window 40*a* is defined to be 20° or less and is selected within the range. As a result, the optical path of the mode component appearing on the FFP, which is to be removed, is shielded by the shielding cover 40 and only the necessary mode component is lead out from the light-leading window 40*a*.

Next, a method of manufacturing the semiconductor emission apparatus will be described.

First, a base 30 and a shielding cover 40 are prepared. The base 30 is formed using, for example, Fe (iron) or Cu (copper) as one body with a heat sink 31 and a pin 32 electrically connected to each other. Then, the other two pins 32 are fixed on the base 30 with a circular insulating glass being interposed therebetween. The pins 32 can also be formed using iron (Fe) or copper (Cu). It becomes easier to connect the pins 32 to a wire 33 by plating the pins with Au. The shielding cover 40 can also be formed using, for example, Fe or Cu. The light-leading window 40*a* is sealed by a quartz thin plate (not shown). It is preferable to apply an anti-reflection coating on the thin plate corresponding to the oscillation wavelength band for suppressing the return light. The material for the light-leading window 40*a* is determined considering the loss of the light adsorption. However, if the wavelength is 400 nm or more, soda glass can be used, which is less costly and sustains little loss.

The materials and the thickness of each layer of the semiconductor laser 10 are set, for example, as shown in Table 1. Examples of the forming method from the n-side contact layer 112 to the p-side contact layer 120 on the GaN substrate 111 are MOCVD (Metal Organic Chemical Vapor Deposition) and MOVPE (Metal Organic Vapor Phase Epitaxy). Other well-known methods of growing crystal may also be used.

TABLE 1

| | MATERIAL | THICKNESS |
|---|---|---|
| N-type Contact Layer 112 | GaN | 4.5 μm |
| N-type Cladding layer 113 | $Al_{0.08}Ga_{0.92}N$ | 1.0 μm |
| Optical Guide Layer 114 | GaN | 120 nm |
| Active Layer 115 | $In_{0.14}Ga_{0.86}N/$ $In_{0.02}Ga_{0.98}N$ | 3.5/7.0 nm |
| Anti-diffusion Layer 116 | $Al_{0.16}Ga_{0.84}N$ | 20 nm |
| Optical Guide Layer 117 | GaN | 90 nm |
| Anti-carrier-overflow Layer 118 | $Al_{0.08}Ga_{0.92}N$ | 50 nm |
| P-type Cladding layer 119 | $Al_{0.06}Ga_{0.94}N$ | 560 nm |
| P-type Contact Layer 120 | GaN | 100 nm |

On the top surface of the p-type contact layer 120, for example, titanium (Ti), platinum (Pt), and a substrate (Au) are evaporated in this order and then patterned by photoresist coating or etching thereby to obtain a p-side electrode 121. At last, by cleaving the semiconductor structure obtained as described, a pair of laser resonator reflection surfaces are formed. Thereby, a semiconductor laser 10 is obtained.

The sub-mount 20 is fabricated by evaporating a metallic layers 21a and 21b made of, for example, gold (Au) on the top surface of a substrate 22 made of, for example, aluminum nitride (AlN) with an excellent thermal conductivity, and then patterning it. At this time, the metallic layer 21b is provided to cover the bottom face of the substrate 22 as shown in FIG. 4. It is sufficient to provide, for example, 100 $\mu$m space between the metallic layers 21a and 21b. However, in order to successfully insulate the metallic layers 21a and 21b, an insulating layer made of silicon oxide ($SiO_2$) thicker than the metallic layers 21a and 21b may be formed in between.

Next, a solder layer made of, for example, tin (Sn) is formed by patterning on the metallic layer 21a of the sub-mount 20. Then, die bonding is performed by connecting the semiconductor laser 10 to the sub-mount 20 through the solder layer pre-formed therein. At this time, the solder layer is heated to 240° C. or more. In order to obtain an excellent wetting characteristic, mixed gas of nitrogen ($N_2$) and hydrogen ($H_2$) may be sprayed or the mixed gas atmosphere may be provided when heating the solder layer.

Then, the sub-mount 20 is attached to the heat sink 31 of the base 30 by soldering. It is desirable that the heating temperature of the solder at this time is lower than that in the die bonding described above. For example, indium (In) or silver (Ag) can be used after heating it to 150° C. Then, a wire bonding is performed for connecting the wire 33 made of, for example, gold (Au) by a thermal compression method or ultrasonic method. Thereby, as shown in FIG. 4, the metallic layer 21a and the pin $32b_1$ are connected and the metallic layer 21b and the GaN substrate 111 of the semiconductor laser 10 are connected.

As described, in the embodiment, each of the p-side electrode 121 and the GaN substrate 111 of the semiconductor laser 10 is connected to the respective pin 32b via the metallic layers 21a and 21b of the sub-mount 20. Therefore, the connecting process of the electrodes is simplified.

Next, a cylindrical shielding cover 40 is fixed by welding to the base 30 on which the semiconductor laser 10 is mounted. At this time, for example, in a dry air or dry $N_2$ gas, a ring welding method is used in which the whole periphery of the shielding cover 40 is instantly welded by electric heating. As a result, the inside sealed by the base 30 and the shielding cover 40 is protected from humidity in the open air. Therefore, deterioration in the electrodes and wire bonding, or growing whiskers on the tin (Sn) solder is suppressed.

In the semiconductor emission apparatus manufactured as described, when injecting electric current with larger amount than threshold current to the p-side electrode 121 of the semiconductor laser 10 through the pin 32b, a laser is oscillated in the multi-quantum well active layer 115. The laser light is emitted from the two resonator end faces of the semiconductor laser 10 along the above-mentioned Z-axis. However, the light is reflected on the side of base 30 so that the light emitted from the light-leading window 40a of the shielding cover 40 becomes the optical output in the emission apparatus.

At this time, in the FFP of the light emitted from the semiconductor laser 10, there is a spike-like peak (Cherenkov light) in the end of the main peak located in the center as described (FIG. 1D). The position of the peak in Cherenkov light is on the conical face with the apex angle θ (about 22.5°) obtained by the formula (1) as previously described. A spike in this case is generated by energy of waveguide light leaked from the n-type cladding layer 113 to the GaN substrate 111 so that it appears not as a ring in the cross section of the cone but as a crescent form on the GaN substrate side. However, the size of the light-leading window 40a in the shielding cover 40 is set to have the apex angle of 20° or less in consideration of taking the apex angle θ of Cherenkov light so that Cherenkov light is physically shielded by the shielding cover 40. Therefore, only the main peak component existed in the range capable of passing the light-leading window 40a is outputted. As a result, the beam pattern outputted from the apparatus becomes the unimodal peak.

As described, in the semiconductor emission apparatus according to the embodiment, the size of the light-leading window 40a of the shielding cover 40 is defined so as to shield the optical path of Cherenkov light. Therefore, only the main peak component can be outputted and the beam pattern can be made unimodal peak easily and successfully.

Second Embodiment

Figure 6:
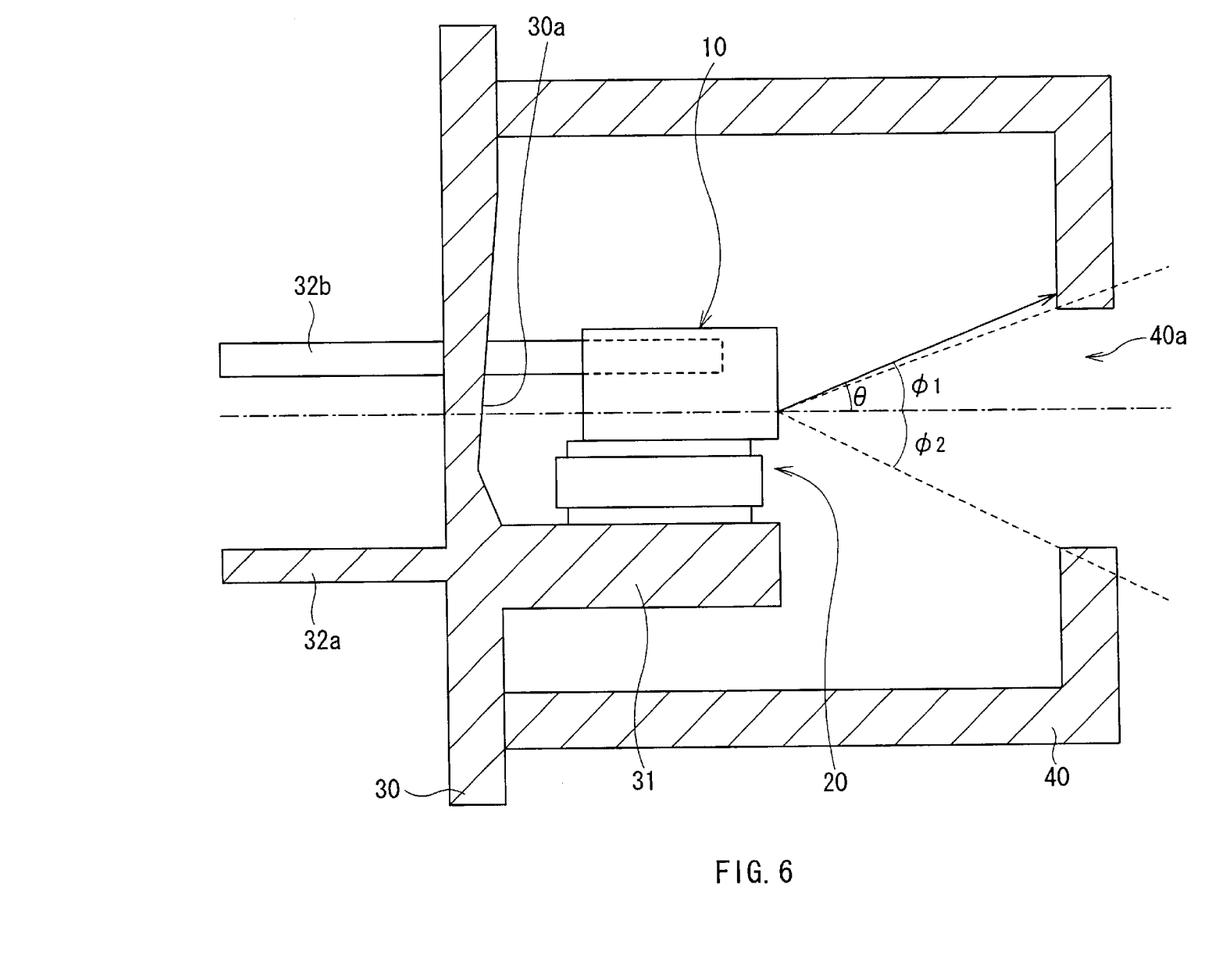
FIG. 6 is a cross section showing the configuration of a semiconductor emission apparatus according to a second embodiment of the invention.

FIG. 6 shows the configuration of a semiconductor emission apparatus according to a second embodiment of the invention. The same codes are used for the same structural elements as those in the first embodiment and the description will be omitted. In the embodiment, the size of the light-leading window 40a of the shielding cover 40 is defined by two apex angles $\phi_1$ and $\phi_2$ in YZ plane by the Y-axis and Z-axis described in the first embodiment. The apex angle $\phi_1$ on the GaN substrate 111 side where Cherenkov light appears is set to be 20° or less and the other apex angle $\phi_2$ is to be larger than 20°. The reason is that it is sufficient only to control the size of the light-leading window 40a of the shielding cover 40 on the GaN substrate 111 side in order to shield Cherenkov light.

In the embodiment, a slope 30a is provided in the inner face of the base 30 in order to prevent Cherenkov light from being reflected by the base 30 a plurality of times and emitted from the light-leading window 40a. Thereby, leakage of Cherenkov light outside the apparatus can be more successfully prevented.

As described, also in the semiconductor emission apparatus according to the embodiment as in the case of the first embodiment, the size of the light-leading window 40a of the shielding cover 40 is defined so as to shield the optical path of Cherenkov light. Therefore, only the main peak component can be outputted and the beam pattern can be made unimodal peak easily and successfully.

Third Embodiment

Figure 7:
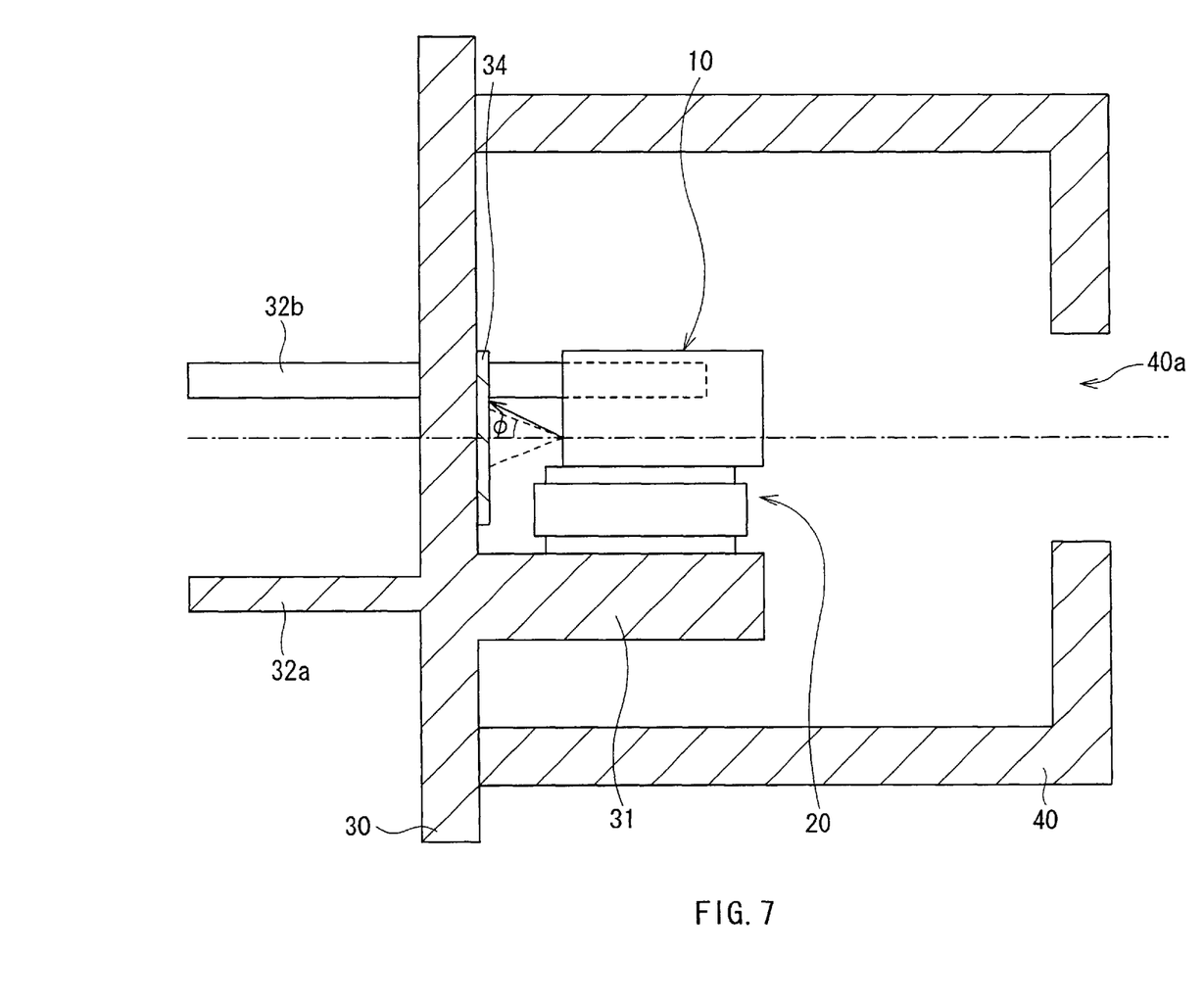
FIG. 7 is a cross section showing the configuration of a semiconductor emission apparatus according to a third embodiment of the invention.

FIG. 7 shows the configuration of a semiconductor emission apparatus according to a third embodiment of the invention. In the embodiment, the same codes are also used for the same structural elements as those in the first embodiment and the description will be omitted.

In the embodiment, a light absorber 34 is provided in the inner face of the base 30. The position of the light absorber 34 is defined in the same manner as that of defining the size of the light-leading window 40a of the shielding cover 40 in the first embodiment. The light absorber 34 covers at least the external portion of the cross section of the base 30 of the conical face (dotted line in the figure) with the apex angle $\phi$ against the Z-axis having the apex being the end face (rear end face) opposite to the base 30 of the semiconductor laser 10.

Cherenkov light appears in the FFP in the rear end face as on the opening side. Cherenkov light emitted from the rear end face repeats multiple reflections and is emitted from the light-leading window 40a. As described in the first embodiment, Cherenkov light is in the position where the apex angle θ is about from 20° to 23° (an arrow in the figure). Therefore, the apex angle φ for defining the position of the light absorber 34 is 20° or less.

As the light absorber 34, any material capable of absorbing oscillation wavelength of Group III–V nitride semiconductor laser may be used. For example, the GaAs substrate may be cut out to be used. Such light absorber 34 is attached to the predetermined position on the base 30 by an adhesive such as epoxy resin. Also, a pin diode made of silicon may be applicable as the light absorber 34. In this case, there is an advantage that the pin diode can absorb Cherenkov light and functions as an emission monitor at the same time.

As described, in the semiconductor emission apparatus according to the embodiment, the light absorber 34 is to be provided at least on the optical path of Cherenkov light in the inner face of the base 30. Therefore, Cherenkov light on the rear end face side is absorbed, thereby preventing the reflection. As a result, only the main peak component can be outputted from the light-leading window 40a of the shielding cover 40 and the beam pattern can be made unimodal peak easily and successfully.

Fourth Embodiment

Figure 8:
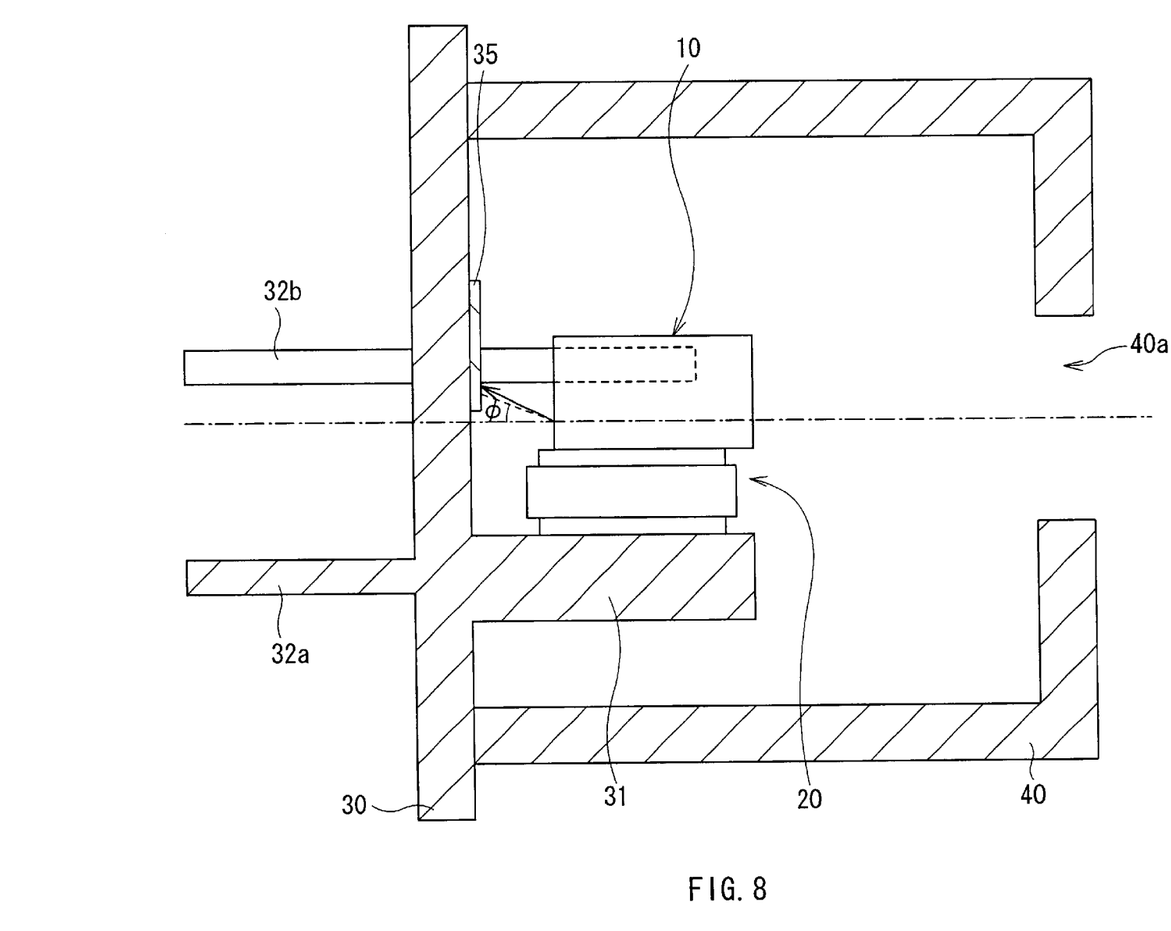
FIG. 8 is a cross section showing the configuration of a semiconductor emission apparatus according to a fourth embodiment of the invention.

FIG. 8 shows the configuration of the semiconductor emission apparatus according to a fourth embodiment of the invention. In the embodiment, the position of a light absorber 35 is defined by the apex angle φ a on the GaN substrate 111 where Cherenkov light appears and φ is set to be 20° or less. The reason is that it is sufficient to partially provide the light absorber 35 in the range limited to the GaN substrate 111 on the face of the base 30. Other configurations are the same as those in the third embodiment so that the description will be omitted.

In the semiconductor emission apparatus according to the embodiment, the light absorber 35 is also provided at least on the optical path of Cherenkov light in the inner face of the base 30. Therefore, as in the third embodiment, Cherenkov light on the rear end face side is absorbed, thereby preventing the reflection. As a result, only the light of the main peak component can be outputted from the light-leading window 40a of the shielding cover 40 and the beam pattern can be made unimodal peak easily and successfully.

In the third embodiment and the fourth embodiment, the configuration of the light-leading window 40a of the shielding cover 40 may be defined in the same manner as in the first embodiment or as in the second embodiment.

EXAMPLE

Specific examples of the invention will be described.

Figure 9:
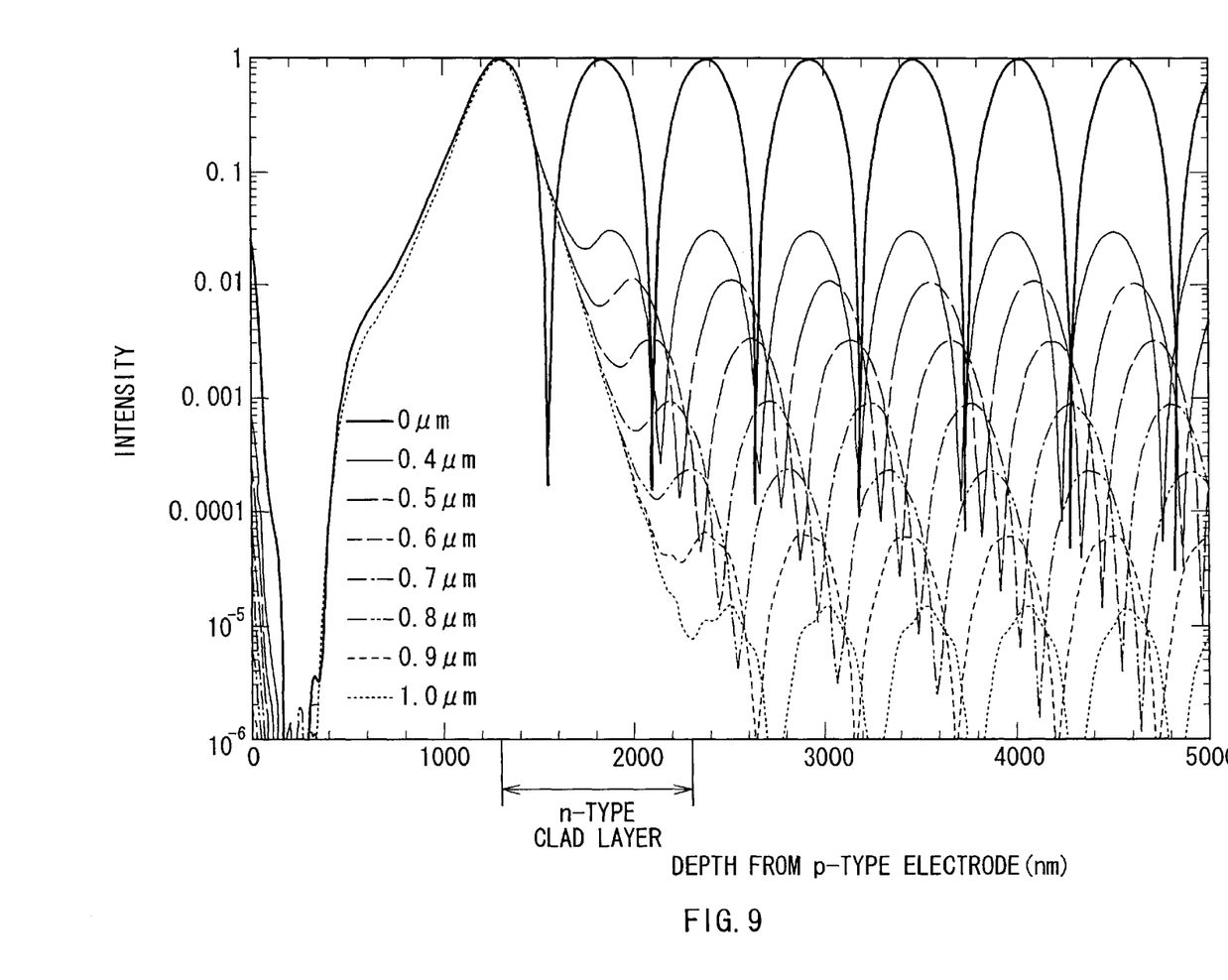
FIG. 9 shows the calculated values of the optical intensity distribution of the semiconductor light-emitting device shown in FIG. 5.

First, the distributions of the optical intensity of the semiconductor light-emitting device having the same configuration as the above-mentioned embodiments were obtained by calculation. The material and thickness of each layer was set as shown in Table 1. However, the layer thickness of the n-type cladding layer 113 was changed to 0, and in the range from 0.4 μm to 1.0 μm in 0.1 μm steps. FIG. 9 shows the results of calculating the distributions of the optical intensity. The light guided in the active layer 115 was simply decreased in the n-type cladding layer 113 but generated vibration at the intensity when reaching the GaN substrate. The vibration mode was the component forming spikes on the FFP. From the figure, it was verified that the thinner the thickness of the n-type cladding layer 113 was, the larger the intensity of the light leaked to the GaN substrate 111 became. Also, it was verified that the mode of the GaN substrate 111 could not be ignored even the thickness of the n-type cladding layer 13 was set to be 1.0 μm so that the light was insufficiently confined.

As described, in order to add further effects of confining the light in the n-type cladding layer 113, the index of refraction may be decreased or the layer thickness may be increased. However, if aluminum (Al) is added in order to decrease the index of refraction, the stress in the interface between the GaN substrate 111 increases. Therefore, the critical film-thickness where clacks are generated becomes thinner so that, inversely, the layer thickness needs to be made thinner. The composition of $Al_{0.08}Ga_{0.92}N$ which has a large quantity of aluminum (Al) is selected for the n-type cladding layer 113. Therefore, the layer thickness of the n-type cladding layer 113 becomes thinner even if the quantity of aluminum (Al) is further increased and the index of refraction is increased. Thereby, it is considered that no more effect of confining the light can be expected.

Next, such a semiconductor light-emitting device was fabricated by the above-mentioned method. Then research was conducted on the n-type cladding layer 113 made of $Al_{0.08}Ga_{0.92}N$ to find out the thickness of the layer which can be formed without generating cracks. As a result, it was verified that cracks were generated in the n-type cladding layer 113 with 1.0 μm or less in thickness.

On the other hand, it has been verified from the calculated values that the light cannot be sufficiently confined even if the thickness of the n-type cladding layer 113 is 1.0 μm. Therefore, although leakage of the light to the substrate can be completely shielded by decreasing the index of refraction or increasing the layer thickness theoretically, it is only possible in this case to select the best condition from a combination of the two methods. From the above-mentioned results, it was verified that the best condition of the n-type cladding layer 113 of the semiconductor light-emitting device was that the composition amount of aluminum (Al) in AlGaN was about 0.06 to 0.08 and the thickness was 1.0 μm or less.

It is now considered to suppress leakage of the spike component, which is emitted from the light-emitting device, from the shielding cover but not to suppress emission of the spike component from the semiconductor light-emitting device. First, the position of the spike generated in the semiconductor light-emitting device in which the cladding layer 113 was formed as 800 nm thick $Al_{0.08}Ga_{0.92}N$ layer was obtained. The apex angle θ of the conical face defining the position of the spike can be obtained by the above-mentioned formula (1). The FFP in the vertical direction of the device was measured and neff was obtained from half the width of the FFP. The obtained value of neff was 2.507 and that of nsnb was 2.536. Thereby, the angle θ was 22.5°.

In the case of the device, the spike-like peak appears in the position where the apex angle θ is approximately 23°. This coincides quite well with literature by M. Kuramoto and others (M. Kuramoto et. al., IEICE Trans Electron., vol. 83-c, No. 4, 552–559 (2000)). According to the literature, in a blue-color semiconductor laser formed on a GaN substrate, the value of $n_{eg}$ (neff in this application) obtained from the measured value of the same FFP as that in example is 2.504. Half the width of the FFP in the vertical direction in this case was 24°, and the position of Cherenkov light is 21°, which also coincides well with example. In the literature, the longitudinal mode spacing of spectrum is also analyzed and it has been verified that the results coincide with the other reports of experimental results (K. H. Hellwege, ed., Landolt-Bornstein, Springer-Verlag, Berlin-Heidelberg-New York (1982)). According to this, it is verified that the calculation method of neff and method of defining the size of the light-leading window 40a in this application are appropriate. Also, the apex angle θ of the spike-like peak in example was almost the same as that in the reports by Nakamura and others, and Nido and the others. As described, the reported values of Cherenkov light in the Group III–V nitride semiconductor laser using the GaN substrate are generally about 20°. Therefore, it is considered that the two conditions, that is, the index of refraction and the film thickness of the cladding layer have already been optimized and there is a limit to the approach to removing Cherenkov light in terms of material designing.

Thereby, a semiconductor emission apparatus was designed to cover the optical path of the spike component by a shielding cover and to provide a light-leading window of the shielding cover on the optical path of the component guided by an active layer. In other words, the light-leading window of the shielding cover was designed to be a circle with the apex angle of 20° or less. When the semiconductor emission apparatus was fabricated in the same manner as that in the first embodiment, the FFP was unimodal and there was no spike observed. Therefore, it was verified that unimodal laser light without the spike component could be obtained by considering the design of the apparatus to physically shield the light.

As described, the invention has been described by referring to the embodiments and example. However, the invention is not limited to these but various kinds of modifications are possible. For example, in the above-mentioned embodiments and example, the wiring pattern of the sub-mount 20 is corresponded with the electrical conductive type of the GaN substrate 111 being the n-type and the node wire of the semiconductor laser being the cathode common node wire used for common optical disks such as CDs, MDs, and DVDs. However, the invention does not depend on the electrical conductive type of the substrate, and types of the anode and cathode common node wires, and any of them can be freely selected. Also, in the above-mentioned embodiments and example, the heat radiating characteristic is obtained by connecting the pn junction side of the semiconductor laser 10 to the heat sink 31 (Junction-Down method). However, inversely a configuration may be applicable in which the substrate 111 side may be connected to the heat sink 31 (Junction-Up method). Such a configuration is advantageous that connections become easier and less stress is added to the junction.

Also, in the second embodiment, the slope 30a is provided in the inner face of the base 30. This is not limited to the second embodiment but may be applied to other embodiments in combination.

Furthermore, in the above-mentioned embodiments and example, the substrate of the semiconductor laser 10 is to be the GaN substrate 111. However, the invention is applicable not only to the GaN substrate but also to other substrates in which a leakage of the waveguide mode may occur. For example, the invention is also preferably applicable to a SiC substrate in which also a spike-like peak is generated in the position where the apex angle θ is about 20°. In addition, the invention is applicable regardless of semiconductor laser configurations.

Moreover, in the above-mentioned embodiments and example, the waveguide component to be removed is Cherenkov light. The invention physically shields the component to be removed in the beam pattern. Therefore, the invention is applicable regardless of the generation mechanism of the beam component to be removed.

As described, in a semiconductor emission apparatus of the invention, the unnecessary component among the beam component emitted from the semiconductor device is shielded by an enclosing member. Therefore, with a simple configuration, only the main mode component can be lead out by shielding the unnecessary mode component and unimodal beam can be obtained easily and successfully.

Especially, in the semiconductor emission apparatus as claimed in one aspect of the invention, an emitted-light absorber is provided in a portion to be the emission path of the unnecessary component among the component of the beam, in an inner wall opposite to the light-leading window in the enclosing member. Therefore, the unnecessary mode component on the rear end face side is absorbed and the reflection is suppressed. As a result, the unnecessary mode component can be more successfully shielded and only the main mode component light can be outputted.

Obviously many modifications and variations of the present invention are possible in the light of above teachings. It is therefore to be understood that within the scope of the appended claims the invention may be practiced otherwise than as specifically described.

What is claimed is:

1. A semiconductor emission apparatus comprising:
   a semiconductor light-emitting device oscillating an optical beam; and
   an enclosing member for enclosing the semiconductor light-emitting device while having a light-leading window for emitting a beam oscillated from the semiconductor light-emitting device, and for shielding an unnecessary component among the component of the beam.

2. A semiconductor emission apparatus as claimed in claim 1, wherein the semiconductor light-emitting device has a structure in which a Group III–V nitride semiconductor film including at least one kind of element selected from the group consisted of aluminum (Al), gallium (Ga), indium (In) and boron (B) is laminated on a substrate made of gallium nitride (GaN).

3. A semiconductor emission apparatus as claimed in claim 1, wherein
   the semiconductor light-emitting device has a laminated structure in which an active layer is sandwiched between a pair of cladding layers on a substrate and a beam is emitted from the end face of the active layer when electric current is injected from an electric current injection region; and
   the enclosing member shields the component of the beam generated at the position at angle θ satisfying the following formula:

$$\sin^2\theta = n_{sub}^2 - n_{eff}^2$$

(where θ is the apex angle of the conical face with the axis orthogonal to two central lines as the central axis, provided that on the end face for beam emission, the node of a central line in the thickness direction of the active layer and a central line in the width direction of the electric current injection region is the apex, nsub is the index of refraction of the substrate, neff is the index of effective refraction of waveguide mode in the active layer and the cladding layers).

4. A semiconductor emission apparatus as claimed in claim 3, wherein the angle θ is from 20° to 23°, both inclusive.

5. A semiconductor emission apparatus as claimed in claim 3, wherein the light-leading window is provided in a region inside a conical face with the apex angle 20° from the axis orthogonal to two central lines, provided that on the end face of emitting a beam of the semiconductor emission device the node of a central line in the thickness direction of the active layer and a central line in the width direction of the electric current injection region is the apex.

6. A semiconductor emission apparatus as claimed in claim 1, wherein the enclosing member has an emitted-light adsorber in a portion to be the emission path of the unnecessary component among the component of the beam in an inner wall opposite to the end face of emitting a beam on the semiconductor light-emitting device.

7. A semiconductor emission apparatus as claimed in claim 3, wherein the enclosing member has an emitted-light adsorber in a portion to be the emission path of peak component generated in the position at the angle $\theta$ in an inner wall opposite to the end face of emitting a beam on the semiconductor light-emitting device.

8. A semiconductor emission apparatus as claimed in claim 7, wherein the angle $\theta$ is from 20° to 23°, both inclusive.

9. A semiconductor emission apparatus as claimed in claim 5, wherein the enclosing member has an emitted-light adsorber in a region outside the conical face with the apex angle 20° from the axis orthogonal to two central lines provided that in an inner wall opposite to the end face of emitting a beam on the semiconductor light-emitting device the node of a central line in the thickness direction of the active layer on the end face opposite to the end face of emitting a beam and a central line in the width direction of the electric current injection region is the apex.

10. A semiconductor emission apparatus as claimed in claim 1, wherein the enclosing member has a slope in an inner wall opposite to the end face of emitting a beam on the semiconductor light-emitting device.

* * * * *